(12) United States Patent
Chinn et al.

(10) Patent No.: US 6,605,319 B1
(45) Date of Patent: Aug. 12, 2003

(54) USE OF INTEGRATED POLYGEN DEPOSITION AND RTP FOR MICROELECTROMECHANICAL SYSTEMS

(75) Inventors: Jeffrey D. Chinn, Foster City, CA (US); Yi-Hsing Chen, Sunnyvale, CA (US); Robert Z. Bachrach, Burlingame, CA (US); John Christopher Moran, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/074,277

(22) Filed: Feb. 11, 2002

(51) Int. Cl.[7] ............................. C23C 16/22; B05D 3/02
(52) U.S. Cl. ............................ 427/255.28; 427/255.35; 427/397.7; 427/255.7; 438/396; 438/455
(58) Field of Search ....................... 427/255.28, 255.35, 427/255.7, 397.7; 438/396, 455

(56) References Cited

U.S. PATENT DOCUMENTS

| | | | |
|---|---|---|---|
| 6,082,208 A | * | 7/2000 | Rodgers et al. ............... 74/408 |
| 6,096,149 A | | 8/2000 | Hetrick et al. |
| 6,156,654 A | | 12/2000 | Ho et al. |
| 6,169,321 B1 | * | 1/2001 | Nguyen et al. ............. 257/536 |
| 6,174,820 B1 | | 1/2001 | Habermehl et al. |
| 6,238,580 B1 | | 5/2001 | Cole et al. |
| 6,299,462 B1 | * | 10/2001 | Biegelsen .................... 439/81 |
| 6,317,342 B1 | * | 11/2001 | Noworolski et al. .......... 363/59 |
| 6,450,654 B1 | * | 9/2002 | Koester ....................... 359/872 |

OTHER PUBLICATIONS

V. V. Afanas'ev et al., "Thermally Induced Si(100)/SiO2 Interface Degradation in poly–Si/SiO2/Si Structures—Evidence for a Hydrogen Stimulated Process," Journal of the Electrochemical Society, 2001, G278–279, 148 (5).

P. L. Bergstrom et al., "Investigation of Thick Polysilicon Processing for MEMS Transducer Fabrication," SPIE, Sep. 1999, pp. 87–96, vol. 3875, Part of the SPIE Conference on Materials and Device Characterization in Micromachining II, Santa Clara, California.

K.–S. Chang–Liao et al., "Physical and electrical properties in metal–oxide–Si capacitors with various gate electrodes and gate oxides," J. Vac. Sci. Technol. B., Jul./Aug. 1997, pp. 942–947, 15(4).

(List continued on next page.)

*Primary Examiner*—Bret Chen
(74) *Attorney, Agent, or Firm*—Shirley L. Church; Barton A. Smith (57) ABSTRACT

The method of the invention involves depositing a plurality of thin layers of film, each layer having a thickness ranging from about 500Å to about 2000Å. Low Pressure Chemical Vapor Deposition or other techniques known in the art maybe used to deposit each thin layer of film. The film is polysilicon or silicon-germanium, where the germanium content ranges from about 4% by weight to about 20% by weight germanium. A Rapid Thermal Anneal ("RTA") is performed on a deposited thin film layer to relieve residual film stress in at least that film layer. The use of RTA rather than furnace annealing permits much shorter annealing times. Optionally, but advantageously, hydrogen may be present during RTA to permit the use of lower processing temperatures, typically about 20% lower relative to a customary anneal. A series of film deposition/rapid thermal anneal cycles is used to produce the desired, nominal total thickness polysilicon film. This method is generally useful for producing polysilicon films in the range of from about 2 microns to about 20 microns.

34 Claims, 4 Drawing Sheets

OTHER PUBLICATIONS

Longqing Chen et al., "Control of Stresses in Highly Doped Multi–Layer Polysilicon Structures Used in MEMS Applications," Proceedings of SPIE, 2001, pp. 232–238, vol. 4234.

Chen et al., "A thick polysilicon surface micromachined accelerometer based on optical intensity modulation," Dissertation Abstracts International, Feb. 2000, pp. 4116–B, vol. 60, No. 8.

Chang–Auck Choi et al., "Formation of low–stress multi-layered thick polysilicon films for fabrication of microsystems," Proceedings of SPIE, 2000, pp. 307–313, vol. 4174.

Bruce J. Fishbein et al., "Time Resolved Annealing of Interface Traps in Polysilicon Gate Metal–Oxide–Silicon Capacitors," J. Electrochem. Soc., Mar. 1987, pp. 674–681, vol. 134., No. 3.

Sangwoo Lee et al., "The Effects of Deposition Temperature, Annealing, and Phosphorus Doping on the Residual Strain of Thick Polysilicon Films," Journal of the Korean Physical Society, Dec. 1999, pp. S1106–S1110, vol. 35.

D. Maier–Schneider et al., "Elastic properties and microstructure of LPCVD polysilicon films," J. Micromech. Microeng., 1996, pp. 436–466, 6, IOP Publishing Ltd., United Kingdom.

J. R. Morante et al., "Mechanical Properties of Thin and Thick Polysilicon Films for Microsystem Applications," Solid State Phenomena, 2001, pp. 405–416, Vols. 80–81, Scitec Publications, Switzerland.

Mehrdad M. Moslehi et al., "RTP for Advanced CMOS Process Integration," SPIE, 1991, pp. 132–145, vol. 1595.

M. M. Moslehi et al., "RTP: Key to future semiconductor fabrication," Solid State Technology, 1994, pp. 37–45.

Kieran Nunan et al., "Developing a Manufactruable Process for the Deposition of Thick Polysilicon Films for Micro Machined Devices," IEEE/SEMI Advanced Semiconductor Manufacturing Conference, 2000, pp. 357–366.

Janak Singh et al., "Strain studies in LPCVD polysilicon for surface micromachined devices," Sensors and Actuators, 1999, pp. 133–138, 77, Elsevier Science S.A.

J. Y. –C. Sun et al., "Rapid Thermal Processing of Arsenic–Implanted Polysilicon on Very Thin Oxide," Journal de Physique, Sep. 1988, pp. C4–401–C4–404, vol. 49.

Xin Zhang et al., "Residual–stress relaxation in polysilicon thin films by high–temperature rapid thermal annealing," Sensors and Actuators, 1998, pp. 109–115, A 64, Elsevier Science S.A.

* cited by examiner

USE OF INTEGRATED POLYGEN DEPOSITION AND RTP FOR MICROELECTROMECHANICAL SYSTEMS

BACKGROUND OF THE INVENTION

1. Field of the Invention

The invention relates to a method of producing thick films of polycrystalline silicon (polysilicon) or silicon-germanium, from which Micro-Structure Devices ("MSDs"), can be fabricated by a surface micromachining process.

2. Brief Description of the Background Art

MSDs may be purely mechanical devices. These devices may stand alone, or may be electrically connected to microelectronic devices, to carry out electromechanical functions. Increasingly, micromechanical devices are melded with various microelectronic devices in a single substrate/structure, combining functions to create integrated microelectromechanical systems ("MEMS"). Examples of such MEMS devices range from simple sensors and actuators with a single moving part, such as a reed-like polysilicon beam which either senses acceleration or responds to an electromagnetic input, all the way up to complex systems of electrostatic motors acting on loads through micromechanical transmissions. All require reproducible accuracy in every aspect of their construction and functionality, which places extraordinary reliability requirements upon the moving parts of the MEMS.

MSDs may be formed by surface micromachining, where the MSDs are formed by photolithography and etching processes of the kind known in the art of semiconductor processing. The substrate to be micromachined is typically a thick film (generally from 2–20 microns) of polysilicon, attached to an underlying structure which makes up part of the substrate. The underlying base of the substrate may be a silicon wafer of the same sort from which semiconductor devices are fabricated, may be a glass substrate, or may be any other substrate beneficial to the particular device being fabricated. When the MSD is to have moving parts, the polysilicon layer in which an MSD is formed is frequently separated from an underlying potion of the substrate by a "sacrificial layer," generally of silicon oxide. The sacrificial layer holds elements of the MSD in place during the etch process which creates etched structures and is then removed to free structures which become moving parts. The sacrificial layer, which is selectively etched by chemical species different from those which react with polysilicon, is etched or dissolved away, by either a dry etching or a wet process. This releases the formerly captive moving parts of the MSD.

Figure 2A:
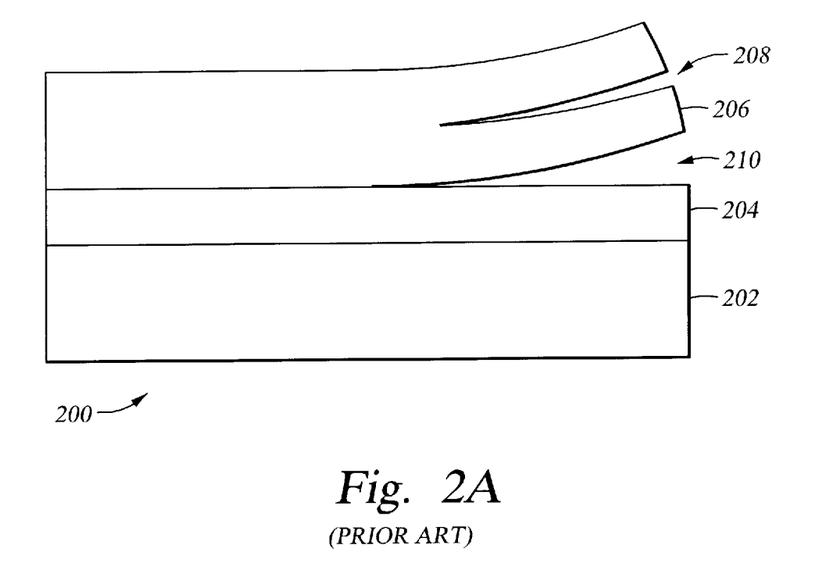
FIG. 2A (Prior Art) is a cross-sectional schematic illustrating a silicon substrate 202, with a sacrificial layer 204, and a thick polysilicon film 206 deposited upon it, in that order, with the thick polysilicon film 206 splitting 208, and delaminating 210 from the sacrificial layer 204, as a result of excessive film stress, or uneven stress gradient over the thickness of the film.
Figure 2B:
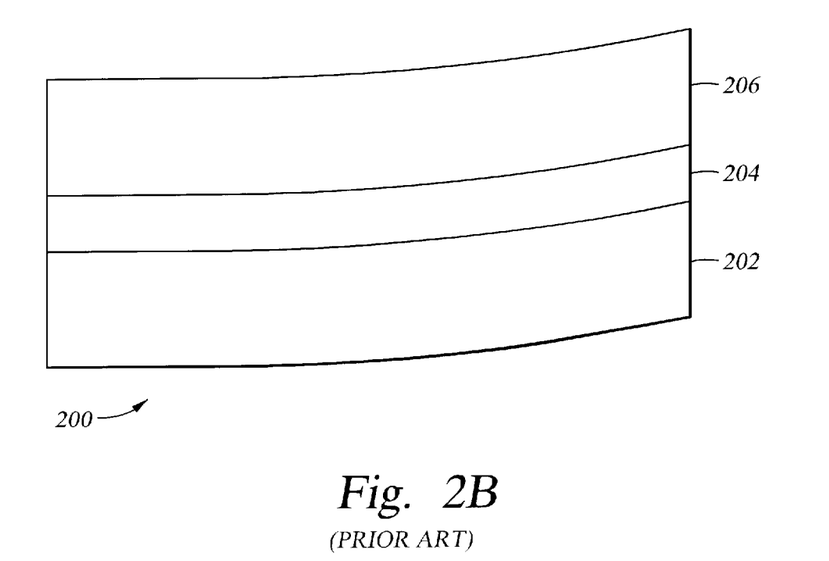
FIG. 2B (Prior Art) illustrates a structure with the same layers as depicted in FIG. 2A, but where the residual stress and uneven stress gradient in the thick polysilicon film 206 have caused deformation of the substrate 202, so that it is no longer flat.

A common and serious problem in production of the MSDs, and especially the highly integrated MEMS devices, is that the thick polysilicon films utilized for their fabrication tend to be deposited upon the underlying substrate (and sacrificial layers, if any) with considerable residual stress, and a non-uniform stress gradient across the thickness of the film, which can cause the film to split or delaminate and curl. This residual stress and stress gradient may cause an MSD element or feature to deform, and may even cause the entire substrate to deform. This problem is illustrated in FIGS. 2A–2B. In FIG. 2A, a structure 200 incorporating a silicon substrate 202 has deposited upon it a sacrificial layer 204 of silicon oxide (for example and not by way of limitation), and, on top of that, a thick layer 206 of polysilicon film. The thick polysilicon film 206 has split (208), and has delaminated (210) from sacrificial layer 204, curling up at the edge, as a result of residual stresses and an uneven stress gradient over the thickness of the film. In FIG. 2B, thick polysilicon film 206 has caused the entire structure 200 to deform, curl upward, along one edge, again as a result of residual stress and stress gradient in the polysilicon film.

Residual film stresses, and especially a non-uniform stress gradient though the film thickness, can be reduced by using an annealing process, but generally these processes require that the structure be exposed to elevated temperatures, typically in excess of about 1,000° C., for an extended period of time. The time period commonly ranges from about 2 hours to about 8 hours for a typical polysilicon film having a thickness ranging from about 2 to about 20 $\mu$m (overlying a substrate about 700 $\mu$m thick). Temperatures of about 1,000° C. and higher may severely compromise any semiconductor elements already present in the structure, causing transistor junctions to migrate due to thermal diffusion of dopant materials, breaking down organic dielectrics, and causing delamination of interfaces between different materials, for example.

What is needed is a means of reducing the levels of residual stress in a thick polysilicon film, and assuring that the remaining stress gradient is uniform over the thickness of the film, while avoiding damage to underlying structures.

SUMMARY OF THE INVENTION

The method of the present invention involves depositing a plurality of relatively thin layers of polysilicon film over one another to form a thick layer of polysilicon film. Each thin layer has a thickness ranging from about 500 Å to about 2,000 Å, with the final combined thickness of all layers ranging from about 20,000 Å to about 200,000 Å. One commonly used method for depositing a layer of polysilicon is by Low Pressure Chemical Vapor Deposition ("LPCVD"). This technique or other techniques known in the art may be used to deposit each thin layer of polysilicon. After a thin film deposition step, an annealing step is performed by Rapid Thermal Processing ("RTP"). Rapid Thermal Anneal ("RTA") may optionally but advantageously be carried out in the presence of hydrogen. The use of RTA rather than furnace annealing permits much shorter annealing times, and the use of hydrogen forming gas during RTA, for example, permits the use of lower processing temperatures, typically about 20% lower relative to a customary anneal. The hydrogen is believed to diffuse into grain boundaries of the polysilicon, reducing stress in the deposited film. By controlling the stress of at least a specific number of the thin layers of polysilicon film, the stress gradient across the composite thick film layer can be controlled as well. A series of film depositions, typically followed by rapid thermal anneal, is used to produce the desired, nominal total thickness polysilicon film. As previously mentioned, this method is generally useful for producing polysilicon films in the range of from about 2 microns to about 20 microns, and typically in the range of about 5–20 microns.

An alternative to a polysilicon film is a silicon-germanium film, where the germanium content ranges from about 4% by weight to about 20% by weight. The electrical conductivity of this material is comparable with that of polysilicon; however, the annealing/heat-treatment temperature for stress relief may be in the range from about 380° C. to about 500° C. This lower annealing/heat-treatment temperature is advantageous when the substrate includes aluminum contacts and interconnects, for example.

During development of a film deposition/rapid thermal anneal process, after each annealing step, a measurement may be made of the residual stress in the film. This measurement can be made directly, as by x-ray spectrographic analysis of the film, or inferentially, as by measurement of the flatness of the silicon wafer, which reveals any deformation of the wafer caused by the residual stress and uneven stress gradient in the o polysilicon film. This flatness measurement can be made, among other methods, by means of an optical flatness measuring tool, or a pin-displacement device, or advantageously by a capacitance device. A pin displacement device or capacitance device may be conveniently built into a wafer handling tool used to transfer the wafer within or among the processing chambers.

Initially, for a given process, based upon the results of the stress and stress gradient measurement, appropriate adjustments may be made to the process parameters for subsequent deposition and/or rapid thermal anneal steps, to optimize the method, providing an aggregate residual film stress which meets nominal requirements, and a uniform stress gradient across the film thickness. The process parameters for the method may then be programmed into software used to control the process apparatus. Subsequent periodic measurements of the stress and stress gradient in thick polysilicon film layers made by the method may be made for quality control purposes.

The application of a plurality of thin polysilicon layers or silicon-germanium layers, with at least a portion of the film deposition steps followed by RTP annealing/heat treatment, for film stress control, may be carried out in two process chambers (a deposition chamber and an RTP chamber), with substrates passed through a connecting interface under controlled conditions. In the alternative, the deposition and annealing steps may be carrier out in a single chamber which is capable of providing both deposition and RTP functions. The deposition and anneal process cycles are continued until the desired total film thickness is achieved.

BRIEF DESCRIPTION OF THE DRAWINGS

FIGS. 3A–3C illustrate an embodiment of the invention in which a series of method steps are used to produce a thick polysilicon film.

FIG. 3B illustrates the structure of FIG. 3A, after deposition and annealing of a second thin polysilicon layer 306lover the first thin layer 306a.

DETAILED DESCRIPTION OF THE INVENTION

I. DEFINITIONS

As a preface to the detailed description, it should be noted that, as used in this specification and the appended claims, the singular forms "a", "an", and "the" include plural referents, unless the context clearly dictates otherwise. All percentages (%) listed for gas constituents are % by volume, unless otherwise indicated.

Specific terminology of particular importance to the description of the present invention is discussed in context throughout.

II. APPARATUS FOR PRACTICING THE INVENTION

The invention may be advantageously carried out in a multi-chamber processing system such as the Precision 5000®, the Endura ®, the Centura ®, the Producer™, or the Endura®SL™, all available from Applied Materials, Inc., of Santa Clara, Calif. These multi-chamber systems (generally illustrated schematically in FIG. 1) permit transfer of substrates among various processing chambers, each designed for a specific type of operation. The multi-chamber systems are designed so that the various processing chambers can be isolated from one another during processing operations, but are interconnected for purposes of transferring substrates between chambers under controlled environmental conditions. Film deposition steps may be advantageously carried out by LPCVD in a POLYgen Centura® chamber, also available from Applied Materials, Inc.; or may be carried out in other similar apparatus known in the semiconductor industry. Rapid annealing steps may be advantageously performed in an RTP XEplus™ Centura® chamber, available from Applied Materials, Inc.; or may be carried out in other similar apparatus known in the semiconductor industry. One skilled in the art of semiconductor processing, in view of the present disclosure, will be able to determine without undue experimentation, the adjustment needed for process conditions when other, similar apparatus is used to carry out the steps of the method. In addition, as previously mentioned, a single chamber may provide both LPCVD capability and heat-treating capability.

III. DETAILED DESCRIPTION OF THE EMBODIMENTS

The present invention provides a method of producing thick films (ranging from about 20,000 Å, to about 200,000 Å) of polycrystalline silicon or silicon-germanium, where the germanium content ranges from about 4% to about 20% by weight. The residual stress in the deposited films is controlled, typically reduced, and the gradient across the thickness of the films is uniform. The uniform gradient across the thick film will reduce any tendency of the film to curl or delaminate, leaving the thick film suitable as a material in which intricately patterned MEMS devices can be formed by surface micromachining.

In one embodiment, a plurality of thin layers of polysilicon, each ranging in thickness from about 500 Å to about 2000 Å, are deposited using LPCVD, and at least a portion of the layers are annealed to control residual film stress and to equalize stress gradient across the film thickness. The polysilicon film deposit/rapid anneal process is carried out multiple times until a total film thickness from about 2 microns to about 20 microns, and more typically from about 5 microns to about 20 microns is achieved. The substrate will often be a standard semiconductor grade silicon wafer, though it can consist of other substrate materials used in semiconductor fabrication, including glass, or any other substrate appropriate for the particular device being fabricated.

Figure 1:
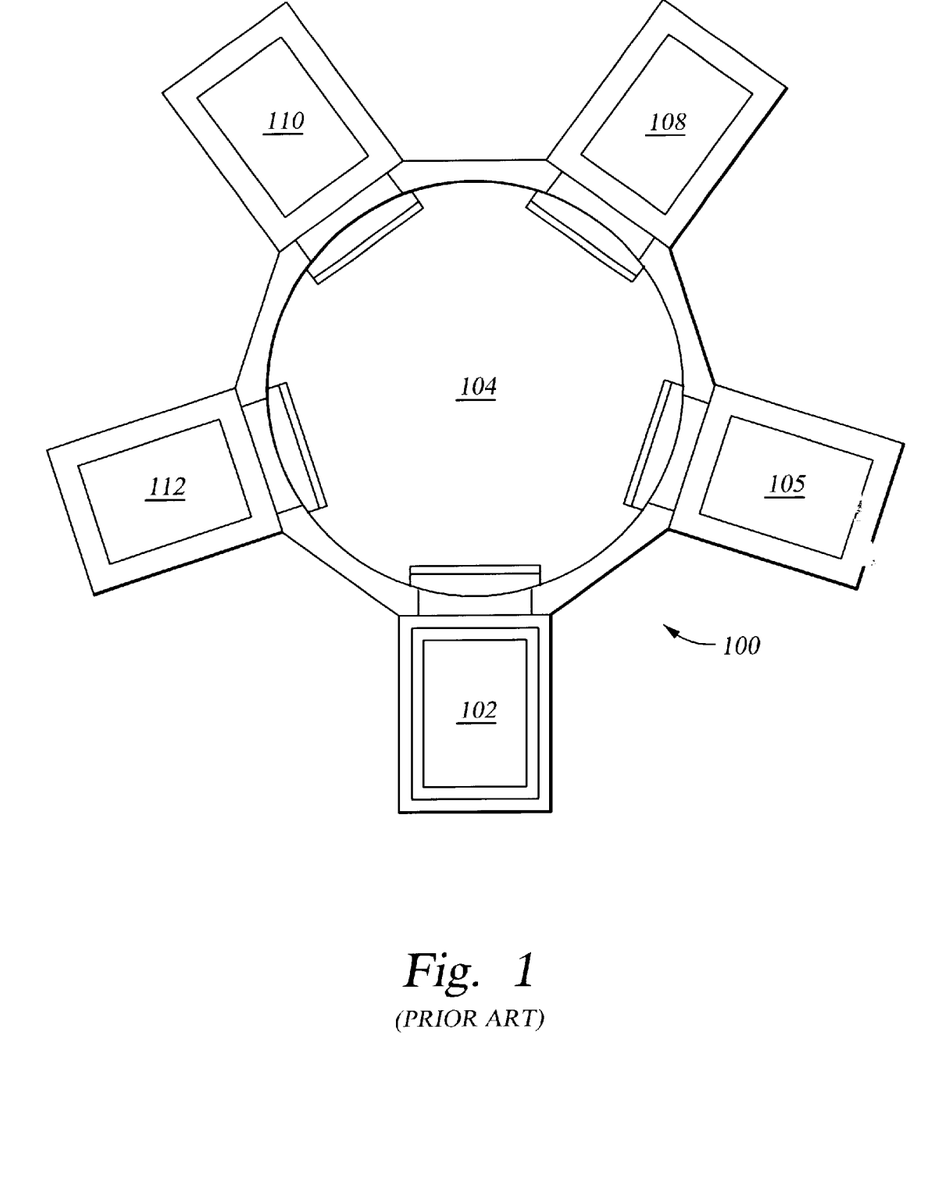
FIG. 1 (Prior Art) is a schematic diagram of a multi-chamber integrated processing system of the kind which may be used for transporting a structure on which a thick polysilicon or silicon-germanium film is being deposited between processing chambers, without exposing the substrate and deposited thin polysilicon layers to an uncontrolled environment.

With reference to FIG. 1, integrated processing system 100 incorporates a load lock 102, through which a substrate can be loaded into the system. Process chambers 106, 108, 110, and 112 are individual process chambers, in which the substrate can be isolated and desired operations carried out. Because the system contains central chamber 104, which interconnects process chambers 106, 108, 110, and 112, a substrate can be maintained in a controlled environment, and be transported among the various processing chambers. This prevents subjecting the substrate to outside conditions until all the processing steps of the present invention have been completed.

Figure 3A:
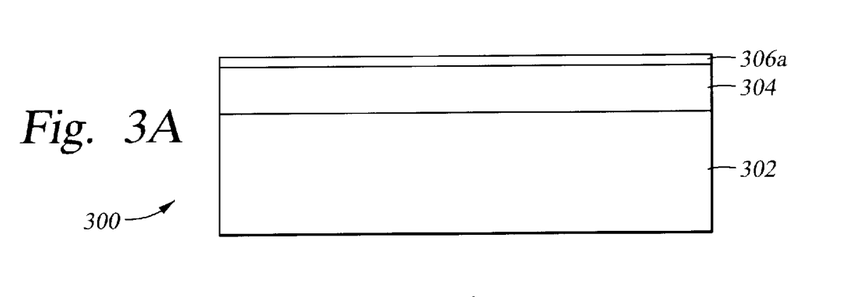
FIG. 3A is a cross-sectional schematic diagram illustrating, in order from bottom to top, a silicon substrate 302, an optional overlying layer 304 of a sacrificial material, and a first deposited thin layer of polysilicon 306a. Polysilicon layer 306a is less than the desired thickness for the final, multi-layered, polysilicon film. The first deposited thin layer of polysilicon 306a has been annealed.
Figure 3B:
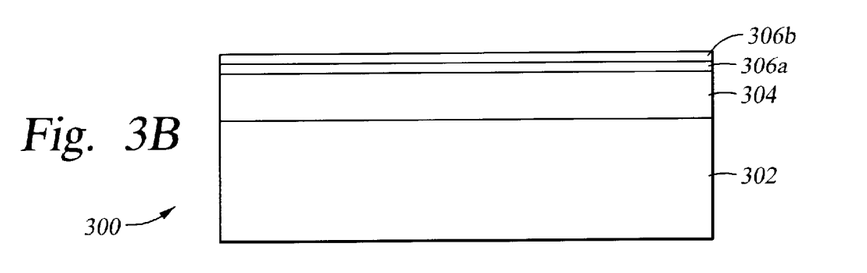
Figure 3C:
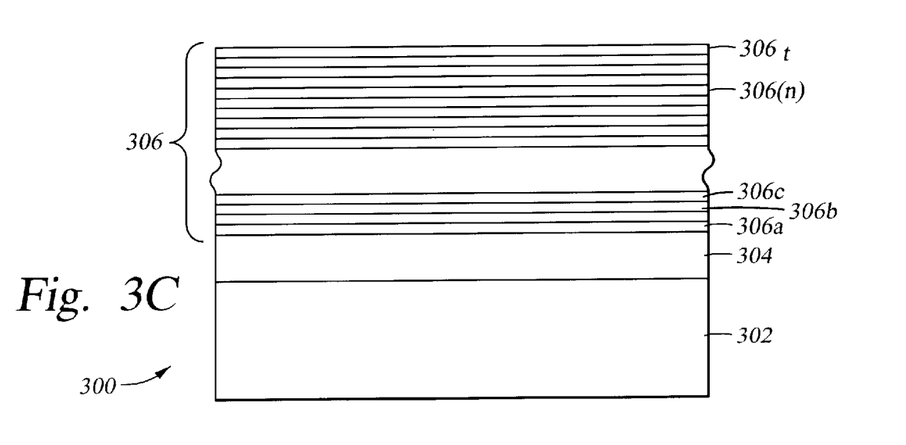
FIG. 3C illustrates the structure of FIG. 3B after a series of additional thin polysilicon layers 306(n) have been deposited and annealed. The total thickness of polysilicon film 306 is equal to a summation of the thickness of the individually deposited and annealed layers (n), to provide a nominal desired overall polysilicon film thickness.

As illustrated in FIGS. 3A–3C, a plurality (n) of individual thin layers 306 of polysilicon are deposited (typically by LPCVD) upon a silicon wafer substrate, with a "rapid annealing" (rapid heat treatment) step carried out periodically, typically after each deposition step. A sacrificial layer of $SiO_X$ 304 may optionally be present under the first thin layer 306a of polysilicon.

When an annealing step is to be carried out, the substrate wafer may be transferred, within a controlled environment of the kind provided by a multi-chamber processing system such as those named above, to a Rapid Thermal Processing chamber where it is subjected to a rapid thermal anneal, in which the polysilicon film is raised quickly to a temperature at which residual film stress is relieved, followed by rapid cooling of the substrate.

The precise times and temperatures at which the RTA can be carried out are a function of the film material composition, the annealing atmosphere used, and the thickness of the film being annealed, as will be illustrated by the specific examples which follow. In any case, the use of RTA generally permits the use of lower annealing temperatures, and invariably permits the use of much shorter annealing times (typically seconds or minutes rather than hours), compared to a conventional furnace anneal. When a source of hydrogen is included in the annealing chamber atmosphere (ambient), it is possible to achieve the required stress relief in a polysilicon film or silicon-germanium film at a lower peak temperature, typically at least 20% lower than the temperature required for a general furnace anneal.

Since the individual film layers are thinner, the time required at annealing temperature for each layer is less, and the summation of the total time at annealing temperature is reduced as well. In addition, due to the rapid increase in film temperature using RTA, it is possible to have an underlying substrate temperature that remains about 50–100° C. lower than the required peak film temperature. By reducing the peak annealing temperature and the time at peak temperature, temperature-sensitive semiconductor devices present in the structure may be protected from harm.

The wafer stress level and gradient may be characterized after completion of formation of the multiple-layered thick polysilicon film for quality control purposes. During initial determination of process parameters, the wafer stress level and gradient may be characterized frequently, for example after a few deposition/anneal cycles or after each deposition/anneal cycle, if desired. Residual film stress and gradient through the film thickness may be advantageously characterized using a tool which measures wafer flatness. Based upon that stress characterization, adjustments can be made to the process conditions to be used in subsequent multiple deposition/anneal cycles, to drive the residual stress to minimal levels and/or to generate a uniform stress gradient across the total film thickness. It may be desirable for some purposes, to adjust the annealing times for new layers being deposited in a single thick film-forming process, in order to tailor the stress gradient across the thickness of the thick film.

With reference to FIGS. 3A to 3C, in one embodiment of the invention, FIG. 3A shows a structure 300 which includes a substrate 302 and optional overlying sacrificial layer 304. A first thin polysilicon layer 306a, has been deposited over sacrificial layer 304 by LPCVD. Subsequently, the structure 300 was transported to an RTP chamber (not shown), where thin polysilicon layer 306a was rapidly annealed, followed by a rapid cool down of the substrate. In an RTP chamber, the surface of a substrate can be very rapidly heated by direct radiant energy from specially designed lamps, going from ambient temperature to a desired temperature in the range of about 750° C. in no more than about 15 seconds; and the surface can be safely and uniformly cooled back to approximately ambient in not more than about 60 seconds.

Following annealing, the residual film stress and stress gradient in thin layer 306a are characterized; and, if desired, adjustments are made to process conditions under which a next thin polysilicon layer will be deposited and/or under which a RTA of the next thin layer, will be carried out. The RTA may be advantageously performed in a hydrogen forming gas atmosphere, consisting of from about 2% to as much as about 20% $H_2$ with the balance $N_2$. (In the alternative, depending of the composition of the film, other sources of hydrogen may be used as well.) Other advantageous annealing environments for RTA of polysilicon films include, by way of example, and not by way of limitation, $N_2/O_2$, or wet steam/$N_2$, or $H_2/O_2/N_2$, where the $H_2$ and $O_2$ are allowed to combust in a controlled manner in the RTP chamber, forming water. With respect to annealing of a silicon-germanium film, the presence of water in the annealing environment may need to be avoided, depending on the germanium content of the film, due to the water solubility of germanium. It is also possible to carry out the rapid thermal anneal in an atmosphere which is inert with respect to the polysilicon of silicon-germanium film being annealed.

In FIG. 3B, following deposition and RTA of thin polysilicon layer 306a, structure 300 is transported back to a deposition chamber (not shown) and a second thin polysilicon layer 306b deposited. Structure 300 is then transported back to the RTP chamber and thin layer 306b is rapid thermal annealed. Either or both of the deposition and anneal steps for thin layer 306b may be carried out in conditions adjusted to reflect the residual stress and stress gradient characterization performed after annealing of underlying thin polysilicon layer 306a. Another such stress characterization may be done following anneal of thin layer 306b. As previously mentioned, there are a number of techniques which can be used to determine whether residual film stress is within the desired range at the end of a deposition/rapid anneal cycle. Such a tool may be conveniently built into one of the process chambers being used, so that a measurement can be taken without removing the wafer from the sealed process environment. Or, a device may conveniently be incorporated into the wafer handling tool used to transfer the wafer from place to place within the chambers.

Based upon the results of a stress characterization of a deposited and annealed film, the next film deposition/anneal cycle may be adjusted. A dopant may be added to the depositing film, the annealing temperature and/or time—temperature profile may be altered, the atmosphere in the annealing chamber may be adjusted or changed, or any other relevant process conditions, or combinations of these may be adjusted. The process continues, with each deposit and rapid anneal procedure followed by a stress characterization of the film, with appropriate adjustments to process parameters made for a subsequently deposited layer, if necessary, tailoring the residual polysilicon film stress, and providing a uniform gradient through the film thickness.

This process is further illustrated in FIG. 3C, wherein succeeding thin polysilicon layers 306a, 306b, 306c, . . . 306(n) have been deposited, annealed, and stress characterized, until the number of individual thin polysilicon layers is sufficient, at layer 306$_T$, to make up the total desired composite polysilicon film thickness.

This process of repeated film stress characterizations followed by adjustments of deposition and/or annealing process conditions for subsequent thin film layers may be, but normally need not be, carried out in regular production operations. Instead, this full process would normally be used initially to determine the most appropriate sequence of deposition and annealing times and conditions, typically to produce a low-stress, uniform stress gradient, thick polysilicon film. Once an optimum range of conditions has been determined, to provide an acceptable process window, further production may be carried out under such conditions with only a periodic measurement of film stresses and stress gradients for quality control purposes. A process variable control system may be used which is programmed to carry out the method within the acceptable process window. If there is a change in the materials used or in the desired properties of the product of the process, the method of determining the desired process condition windows may be repeated.

When the processing tool is used to produce a variety of devices and frequent changes in process conditions are anticipated, the use of an automated stress measurement tool and a programmed controller to receive data on the measured residual film stress and/or stress gradient of a deposited and rapid annealed film may be advisable. In particular, a programmed process variable controller including instructions for the particular process conditions for each product type would be advantageous.

Figure 4:
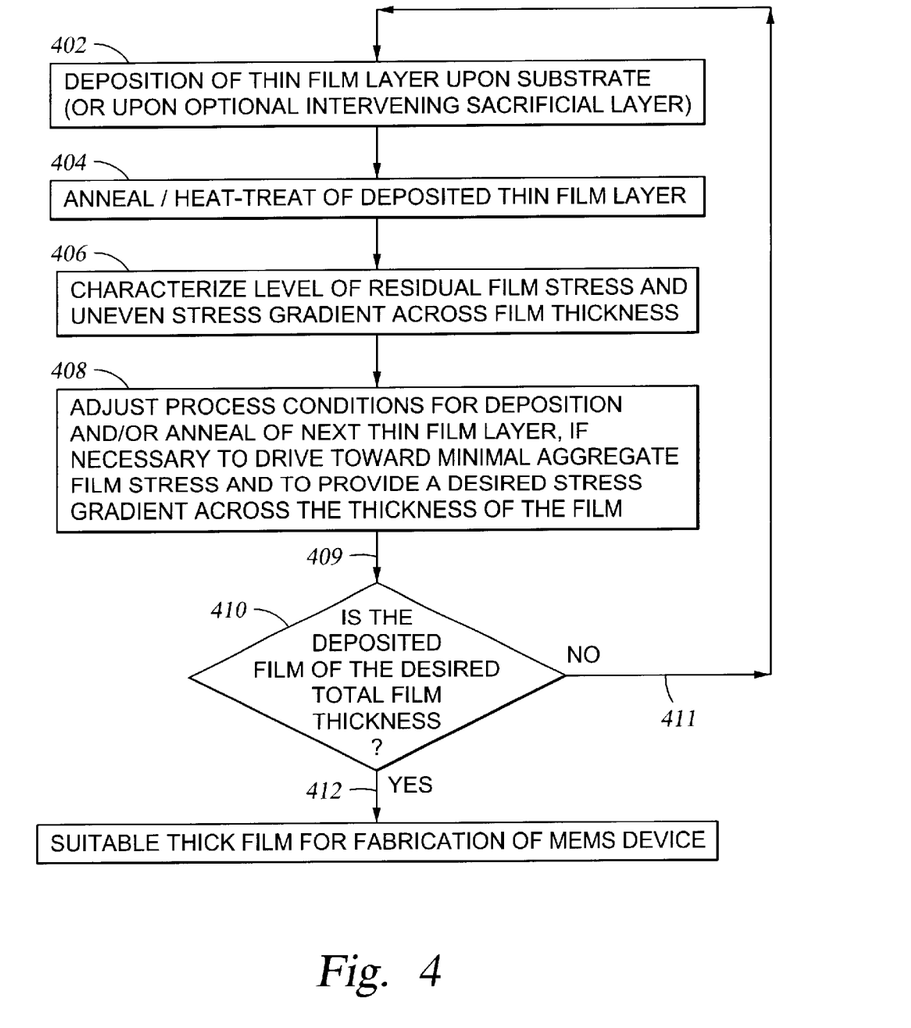
FIG. 4 is a schematic process flow diagram showing the a series of method steps of the kind which may be used in the present invention.

FIG. 4 is a schematic process flow diagram showing a series of steps which may be used in a typical embodiment of the present invention.

In box 402 of FIG. 4, the process is commenced by depositing an individual thin film layer upon a substrate, or upon a sacrificial layer previously deposited atop the substrate. As discussed above, LPCVD is an appropriate mechanism for the deposition of this thin layer, which is in the range of 500 Å to 2000Å thick.

In box 404, the process continues with a Rapid Thermal Anneal of the deposited thin film layer deposited in 402, for the purpose of controlling (typically reducing) residual film stress to a desired nominal stress level, and producing a uniform stress gradient across the thickness of the deposited thin polysilicon layer. RTA is advantageously used for this annealing step because of the short cycle time for which the thin film needs to be raised to temperatures which may damage any associated semiconductor structures, compared to conventional furnace annealing processes.

Box 406 represents a step in which the level of residual stress in the deposited thin film layer may be characterized by various measurements carried out on the film, including conveniently a measurement of the flatness or departure from flatness of the substrate, commonly a silicon wafer, caused by the residual stress, and principally by an uneven stress gradient across the thickness of the film. This flatness measurement may be carried out by a number of means, including optical flatness measurements, measurements of vertical displacement of contact pins or other elements on a tool brought into contact with the substrate, or measurements of the change in capacitance between the wafer and a measurement tool.

As reflected in box 408, based upon the measured stress and stress gradient within the polysilicon film, adjustments may be made in the process conditions for subsequent deposition and/or RTA steps, to minimize the aggregate stress and uneven stress gradient in the film as additional thin film layers are deposited. Such adjustments may be made as frequently as each deposit/RTA cycle, or less frequently, while developing the process parameters for conducting the deposition and anneal processes; but would almost certainly be done significantly less frequently, only as a quality control device, once the process is put into routine production.

Following deposition and RTA steps, and, if appropriate, characterization of the film stress and stress gradient, the process flow 409 leads to a decision box 410, in which the inquiry is whether the film has achieved the predetermined nominal total thickness desired. If it has (412), the film should be ready for use. If it has not (411), the process returns to box 402, for the substrate to undergo another one or more cycles of deposition and RTP anneal of thin film layers During the initial establishment of appropriate deposition and annealing process conditions, it is advantageous to maximize the thickness of each individual polysilicon layer, consistent with maintaining residual film stress and film stress gradient at acceptable levels, in order to minimize the number of cycles required for a given total film thickness.

EXAMPLES:

Example 1

In this Example, the thickness of the deposited polysilicon layer is about 1,000 Å, and the RTA is carried out using a conventional $N_2$ atmosphere in the annealing chamber. The peak temperature reached by the film during annealing is in the range of from about 950° C. to about 1050° C., and the substrate is typically at peak temperature for a period of time ranging from about 30 seconds to about 60 seconds to relieve residual film stress in the deposited polysilicon layer. The maximum substrate temperature typically reaches about 50° C. below the peak film temperature.

Example 2

In Example 2, the thickness of the deposited polysilicon layer is about 1,000 Å, and the RTA is carried out using a hydrogen forming gas atmosphere in the annealing chamber. The hydrogen content of the forming gas is within a range of about 2% to about 8% by volume of $H_2$. In this instance, the polysilicon film temperature typically reaches a peak in the range of from about 800° C. to about 850° C., and the substrate is typically at peak temperature for a period of time ranging from about 15 seconds to about 25 seconds to achieve the desired residual film stress relief. The maximum substrate temperature typically reaches about 100° C. below the peak film temperature.

Example 3

In Example 3, the thickness of the deposited polysilicon layer is about 500 Å, and the RTA is carried out using the hydrogen forming gas atmosphere mentioned with respect to Example 2. The polysilicon film temperature typically reaches a peak in the range of about 750° C. to about 800° C., and the substrate is typically at peak temperature for a period of time ranging from about 5 seconds to about 7 seconds to achieve the required stress relief. The maximum substrate temperature typically is about 700° C.

Typical process conditions for the polysilicon deposition step of an exemplary embodiment method of the invention are presented in Table One, below. The deposition conditions are generally the same for a 1,000 Å thick film as for a 500 Å thick film, with the exception of the deposition time period.

TABLE ONE

Typical Process Conditions for Deposition of Thin Polysilicon Layers

| Process Condition | Polysilicon Deposition |
|---|---|
| Example Thickness of Individual Thin Polysilicon Layer to be Deposited | 1000 Å |
| Film Deposition Process | LPCVD |
| Process gases in chamber | $SiH_4$ (9000 sccm) $PH_3$ (120 sccm) |
| Chamber Pressure, Torr | 275 |
| Chamber Temperature, ° C. | 730 |
| Substrate Temperature, ° C. | 730 |
| Average Polysilicon Deposition Rate, Å/min. | 1500 |

TABLE TWO

Typical Process Conditions for Anneal of Deposited Thin Polysilicon Layers

| Process Condition | Polysilicon Film Anneal, Example 1 | Polysilicon Film Anneal, Example 2 | Polysilicon Film Anneal, Example 3 |
|---|---|---|---|
| Example Thicknesses of Individual Thin Polysilicon Layer to be Annealed | 1000 Å | 1,000 Å | 500 Å |
| Process gases in chamber | $N_2$ | $N_2/H_2$ | $N_2/H_2$ |
| Chamber Pressure, Torr | | 7 Torr to atmospheric (Typical - atmospheric) | |
| Chamber Temperature, ° C. | | Chamber (cool walls) ~ 50–150 | |
| Maximum Substrate Temperature, ° C. | ~1,000 | ~750 | ~700 |
| Maximum Peak Film Temperature, ° C. | 1,050 | 850 | 800 |
| Time at Peak Film Temp., sec. | 30–60 | 15–25 | 5–7 |

The above described embodiments are not intended to limit the scope of the present invention, as one skilled in the art can, in view of the present disclosure, expand such embodiments to correspond with the subject matter of the invention claimed below.

We claim:

1. A method of producing a thick film having a uniform stress gradient across said film thickness, said film adapted to be surface machined to fabricate polysilicon MEMS devices, said method comprising the steps of:
   a depositing upon a substrate a first thin layer of film, having a thickness within a range from about 500Å to about 2000Å;
   b annealing said first thin film layer using RTA; and
   c repeating steps a and a plurality of times to form a thick film having a nominal thickness ranging from about 2 microns to about 20 microns.

2. The method of claim 1 wherein said thick film has a nominal thickness ranging from about 5 microns to about 20 microns.

3. The method of claim 1 or claim 2, wherein said film is polysilicon or silicon-germanium.

4. The method of claim 3, wherein said film is silicon-germanium and where the germanium content of said film ranges from about 4% by weight to about 20% by weight.

5. The method of claim 3, wherein said film is polysilicon, and wherein a sacrificial layer comprising silicon oxide is interposed between said substrate and a first thin polysilicon layer.

6. The method of claim 1, wherein a plurality of thin films is deposited using Low Pressure Chemical Vapor Deposition.

7. The method of claim 1, wherein said film is polysilicon and wherein said RTA is carried out in an atmosphere selected from the group consisting of a hydrogen forming gas, $N_2$, $N_2/O_2$, a noble gas, wet steam/$N_2$, and $H_2/O_2$, reacting to $H_2O/N_2$.

8. The method of claim 7, wherein said RTA is performed at a film temperature in the range of about 700° C. to about 1050° C., for a time period in the range of about 5 seconds to about 30 seconds prior to cooling of said substrate.

9. The method of claim 8, wherein, during said RTA, a maximum bulk temperature of said substrate is less than about 1,000° C.

10. The method of claim 9, wherein, during said RTA, a maximum bulk temperature of said substrate is less than about 700° C.

11. The method of claim 1, wherein said film is silicon-germanium and wherein said RTA is carried out in an atmosphere selected from the group consisting of a hydrogen forming gas, $N_2$, and a noble gas.

12. The method of claim 7 or claim 11, wherein said noble gas is selected from the group consisting of argon, xenon, neon, krypton, and combinations thereof.

13. The method of claim 7 or claim 11, wherein said annealing atmosphere comprises a hydrogen forming gas.

14. The method of claim 13, wherein said hydrogen forming gas comprises hydrogen present at a volumetric concentration in the range of about 2% to about 20%.

15. The method of claim 8, wherein said RTA is performed at a film temperature in the range of about 380° C. to about 500° C., for a time period in the range of about 5 seconds to about 30 seconds prior to cooling of said substrate.

16. The method of claim 15, wherein, during said RTA, a maximum bulk temperature of said substrate is less than about 500° C.

17. The method of claim 16, wherein, during said RTA, a maximum bulk temperature of said substrate is less than about 380° C.

18. A method of determining process parameters for producing a film having a thickness in excess of about 2 $\mu$m, said film adapted to be surface machined to fabricate polysilicon MEMS devices, said method comprising the steps of:
   a depositing upon a substrate a first thin film layer having a thickness within a range from about 500Å to about 2000Å;
   annealing said first thin film layer using RTA;
   c characterizing a residual film stress, a stress gradient, or both said residual film stress and said stress gradient, across the thickness of said first annealed thin film layer;

d based upon said residual film stress, said stress gradient, or a combination of both, adjusting at least one process condition which affects the deposition or annealing of a thin film prior to deposition of a subsequent thin film layer;

e depositing and annealing said subsequent thin film layer, under the adjusted process condition of step d; and f repeating steps a–e a plurality of times to form said thick film.

19. The method of claim 18, wherein said thick film has a nominal thickness ranging from about 5 microns to about 20 microns.

20. The method of claim 18 or claim 19, wherein said film is polysilicon or silicon-germanium.

21. The method of claim 20, wherein said film is silicon-germanium and where the germanium content of said film ranges from about 4% by weight to about 20% by weight.

22. The method of claim 20, wherein said film is polysilicon, and wherein a sacrificial layer comprising silicon oxide is interposed between said substrate and a first thin polysilicon layer.

23. The method of claim 18, wherein a plurality of thin films is deposited using Low Pressure Chemical Vapor Deposition.

24. The method of claim 18, wherein said film is polysilicon and wherein said RTA is carried out in an atmosphere selected from the group consisting of a hydrogen forming gas, $N_2$, $N_2/O_2$, a noble gas, wet steam/$N_2$, and $H_2/O_2$, reacting to $H_2O/N_2$.

25. The method of claim 24, wherein said RTA is performed at a film temperature in the range of about 700° C. to about 1050° C., for a time period in the range of about 5 seconds to about 30 seconds prior to cooling of said substrate.

26. The method of claim 25, wherein, during said RTA, a maximum bulk temperature of said substrate is less than about 1,000° C.

27. The method of claim 26, wherein, during said annealing, a maximum bulk temperature of said substrate is less than about 700° C.

28. The method of claim 18, wherein said film is silicon-germanium and wherein said RTA is carried out in an atmosphere selected from the group consisting of a hydrogen forming gas, $N_2$, and a noble gas.

29. The method of claim 24 or claim 28, wherein said noble gas is selected from the group consisting of argon, xenon, neon, krypton, and combinations thereof.

30. The method of claim 24 or claim 28, wherein said annealing atmosphere comprises a hydrogen forming gas.

31. The method of claim 30, wherein said hydrogen forming gas comprises hydrogen present at a volumetric concentration in the range of about 2% to about 20%.

32. The method of claim 28, wherein said RTA is performed at a film temperature in the range of about 380° C. to about 500° C., for a time period in the range of about 5 seconds to about 30 seconds prior to cooling of said substrate.

33. The method of claim 32, wherein, during said RTA, a maximum bulk temperature of said substrate is less than about 500° C.

34. The method of claim 33, wherein, during said RTA, a maximum bulk temperature of said substrate is less than about 380° C.

* * * * *